(12) United States Patent
Sharples et al.

(10) Patent No.: US 6,521,973 B2
(45) Date of Patent: Feb. 18, 2003

(54) SEMICONDUCTOR DEVICE WITH INTEGRATED POWER TRANSISTOR AND SUPPRESSION DIODE

(75) Inventors: David Sharples, Oldham (GB); Philip K. Knight, Whaleybridge (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/782,662

(22) Filed: Feb. 13, 2001

(65) Prior Publication Data

US 2001/0015475 A1 Aug. 23, 2001

(30) Foreign Application Priority Data

Feb. 15, 2000 (GB) .............................................. 0003302

(51) Int. Cl.$^7$ ........................................... H01L 27/082
(52) U.S. Cl. ...................... 257/577; 257/197; 257/199; 257/474; 257/481; 257/592
(58) Field of Search ................................ 257/197, 199, 257/474, 481, 577, 592

(56) References Cited

U.S. PATENT DOCUMENTS

| | | | | |
|---|---|---|---|---|
| 4,811,065 A | * | 3/1989 | Cogan .......................... | 257/328 |
| 4,969,027 A | * | 11/1990 | Baliga et al. ................ | 257/130 |
| 5,455,064 A | * | 10/1995 | Chou et al. .................... | 427/79 |
| 6,144,046 A | * | 11/2000 | Hanaoka et al. ............ | 257/140 |
| 6,204,717 B1 | * | 3/2001 | Nagasu et al. ............... | 327/318 |
| 6,207,484 B1 | * | 3/2001 | Kim et al. ................... | 438/209 |

FOREIGN PATENT DOCUMENTS

| | | | | |
|---|---|---|---|---|
| EP | 0405200 A1 | | 1/1991 | |
| EP | 0405200 A1 | * | 1/1991 | ........... H01L/29/72 |

OTHER PUBLICATIONS

"Power Semiconductors Applications Handbook", 1995, pp. 243–250 and 319–329.

* cited by examiner

Primary Examiner—Eddie Lee
Assistant Examiner—Matthew E. Warren
(74) Attorney, Agent, or Firm—Steven R. Biren

(57) ABSTRACT

A semiconductor device comprises a semiconductor body (10) in and on which a power transistor (T; 1, 2, 3) and a suppression diode (D; 100) are integrated. A diode junction (40; 40') is present between the back metallization (22) and the adjacent region (2) of the power transistor so as to provide the diode in series with this region (2) and adjacent to the back surface (12) of the body. This diode junction (40; 40') opposes the p-n junction (42) between the collector or drain region (2) of the transistor and its base region (3), so as to suppress reverse current flow in the transistor. The higher doped part (2b) of the adjacent transistor region (2) is sufficiently thick as to prevent any minority charge carriers injected by the diode junction (40; 40') from reaching the p-n junction (42) with the base region (3). The diode junction may be a p-n junction (40) or a Schottky barrier (40'). This transistor-diode configuration also permits an anti-parallel diode (D3) to be mounted side-by-side with the power transistor in the same device package (50–53).

20 Claims, 5 Drawing Sheets

SEMICONDUCTOR DEVICE WITH INTEGRATED POWER TRANSISTOR AND SUPPRESSION DIODE

BACKGROUND OF THE INVENTION

This invention relates to semiconductor devices comprising a power transistor and a suppression diode connected in series with the power transistor so as to suppress reverse current flow in the transistor. The invention also relates to methods of manufacturing such devices.

Current flow through parasitic diodes within power transistors can be problematic in increasing the switching time and switching losses of the transistor. Known power transistor structures generally have a current path between first and second regions (emitter and collector, or source and drain) that are adjacent to respective front and back, opposite surfaces of the semiconductor body. These first and second regions are connected to respective front and back metallisations. The body is generally mounted on a terminal connection area of the device via the back metallisation. A base region of opposite conductivity type is present in the current path (in between the first and second regions) and forms a p-n junction with an adjacent first part of the second region (collector or drain). This first part has a lower conductivity-type-determining dopant concentration than an underlying second part of the second region.

The problematic parasitic diode in the case of an insulated-gate field-effect transistor (often termed MOSFET) is the base-drain p-n junction. The voltage polarity between source and drain (front and back metallisations) of the MOSFET can temporarily reverse, for example when switching an inductive load. This reversed voltage polarity forward biases the parasitic diode, which may then conduct to give a reverse current flow in the transistor.

Because this diode is a bipolar component, it is subject to charge storage effects. It generally has a slow reverse recovery time, which can cause switching losses in operation of the MOSFET. It is known to suppress turn on of the parasitic diode by connecting an opposed, external diode in series with the transistor. Such a transistor-diode circuit arrangement is illustrated in, for example, FIG. 6 on page 249 of the Power Semiconductors Applications Handbook 1995 of Philips Semiconductors, published December 1994 (1133011/12000/02/; document order no. 9398 652 85011) and is discussed on page 250. This FIG. 6 circuit is part of an A.C. motor control and comprises an inverter formed of two such transistor-diode circuit arrangements each with an additional external diode of fast recovery time coupled in anti-parallel relationship to the transistor-diode circuit arrangement. This fast-recovery anti-parallel diode provides the inverter with a reverse current path external to the MOSFET and in place of the suppressed slow-recovery internal (parasitic) diode of the MOSFET.

Similarly in the case of a bipolar transistor, there is a problematic parasitic diode formed by the base-collector p-n junction. When the bipolar transistor is being switched with an inductive load, this parasitic p-n diode may become forward biased so as to inject minority charge carriers, producing a reverse current flow in the transistor and rendering its base drive less stable. Suppression of this parasitic diode would therefore be advantageous. Furthermore, for example, in deflection circuits for televisions and monitors, an external diode (a clamp or damper diode) may be required in anti-parallel with the bipolar transistor. Such a circuit configuration is illustrated in pages 321 to 329 of the said Power Semiconductors Applications Handbook 1995.

SUMMARY OF THE INVENTION

It is an aim of the present invention to provide a convenient arrangement for integrating a diode in series with a power transistor so as to suppress the problematic reverse current flow in the transistor and also for facilitating inclusion of an anti-parallel diode (when required) in the device, at least on the same terminal area of the device as the integrated transistor-diode body.

According to the present invention, there is provided a semiconductor device comprising a semiconductor body in and on which a power transistor and a suppression diode are integrated. The body is mounted on a terminal connection area of the device via the back metallisation. The suppression diode is formed in series with the second (back) region of the power transistor and adjacent to the back surface of the body by a diode junction that is present between the back metallisation and a part of the second region. This diode junction opposes the p-n junction between the second region and the base region so as to suppress reverse current flow in the transistor.

Furthermore, in a device in accordance with the invention, the second region has a sufficient thickness as to prevent any minority charge carriers injected into the second region by the diode junction from reaching the p-n junction with the base region. This thickness is typically at least two or more times larger than a diffusion length for charge carriers of the opposite conductivity type (minority carriers) therein. In many devices, it may be considerably larger (for example, by an order of magnitude) than the minority-carrier diffusion length, and so any minority carriers injected into the second region from the diode will not progress far into the transistor before they recombine with majority carriers in the second region. This thickness may then be the main means for ensuring that no latching (thyristor action) occurs between the diode and the transistor. However the device may also include other technical features that contribute to, or even mainly determine, the prevention of latching. Thus, for example, the diode junction may be so constructed between the back metallisation and the second region of the transistor as to reduce minority carrier injection into the second region.

Several particularly advantageous features and options available with the invention are set out in the appended Claims.

The suppression diode junction may be formed directly with a part of the second region of the transistor. Thus, for example, the back metallisation may provide the suppression diode as a Schottky barrier with the second (back) region, when this region part is not highly doped. An advantage of using a Schottky barrier as the suppression diode is that there is very little injection of minority charge carriers across the Schottky barrier. However, this particular construction can restrict the trade-offs possible between different characteristics of the transistor (for example, the series resistance of the second region) and of the suppression diode (for example, its breakdown voltage).

More versatility can be achieved by including a semiconductor layer on the back surface of the body, between the back surface and the back metallisation. Such a semiconductor layer may have, adjacent to the diode junction, a conductivity-type-determining dopant concentration that is lower than the conductivity-type-determining dopant concentration of the first conductivity type of the adjacent part of the second region.

The lower dopant concentration of the semiconductor layer permits a variety of diode types to be formed with the semiconductor layer. Thus, for example, the adjacent part of the layer having the lower conductivity-type-determining dopant concentration may be of either the first conductivity type or of a second (opposite) conductivity type. The diode may be either a p-n junction diode or a Schottky diode.

Thus, the low doping of the semiconductor layer can allow a Schottky barrier to be formed between the back metallisation and the semiconductor layer, without restricting the doping concentration of the second region of the transistor. By providing such a Schottky barrier as the suppression diode, there is very little injection of minority charge carriers across the diode junction into the semiconductor layer and into the transistor. Thus, there is no significant latch up possibility between the diode and the transistor.

Alternatively, the diode may be formed as a p-n junction with, for example, the second region of the body or with another region within the layer. In this case the lower doping concentration of the layer (adjacent to this p-n junction) reduces minority charge carrier injection into the second region. The p-n junction may be formed at the back surface of the body or within the semiconductor layer. The p-n junction may be parallel to the back surface, or even extend across the thickness of the semiconductor layer between windowed insulating layers.

Typically the dopant concentration of the first conductivity type of the second region may be two or three orders of magnitude higher (i.e. $10^2$ or $10^3$ times higher) than the lower conductivity-type-determining dopant concentration of the semiconductor layer. Under these circumstances in a p-n junction diode, charge carrier injection is predominantly from the second region to the semiconductor layer (and not in the opposite direction), and the minority-carrier diffusion length in the second region can be quite short.

The dopant concentration of the first conductivity type of the adjacent part of the second region may be so much higher than the lower conductivity-type-determining dopant concentration of the semiconductor layer as to be diffused into part of the semiconductor layer. The semiconductor layer may have an interface with the second region over the whole of the back surface of the body, or it may have a more localised interface (at one or more windows in an insulating layer between the semiconductor layer and the back surface of the body ).

Devices in accordance with the present invention have their suppression diode junction integrated in or on the semiconductor body of the transistor, between the back metallisation and the second (back) region of the transistor. This configuration permits an anti-parallel diode to be mounted on the terminal connection area of the device, in side-by-side relationship with the semiconductor body of the transistor. Thus, when the transistor is used in a circuit requiring such an anti-parallel diode, the anti-parallel diode can be included in the same device package as the transistor.

Several of the device structures can also be manufactured advantageously in accordance with the invention.

BRIEF DESCRIPTION OF THE DRAWINGS

These and other features of the invention are illustrated in embodiments of the present invention that are now described, by way of example, with reference to the accompanying diagrammatic drawings, in which.

Figure 1:
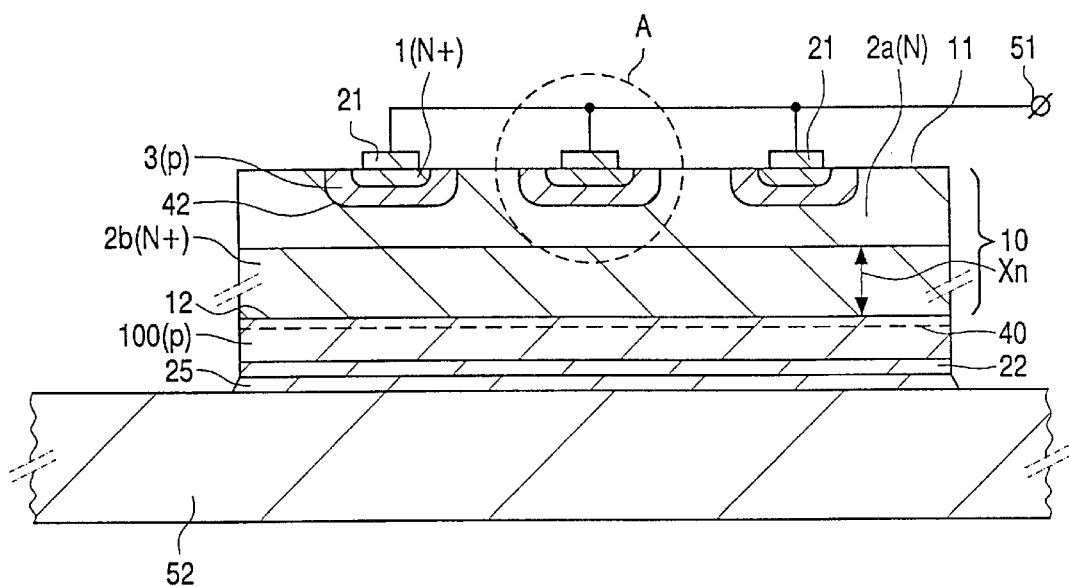
FIG. 1 is a simplified cross-sectional view of one embodiment of a semiconductor device in accordance with the invention, with a p-n junction as the suppression diode.

It should be noted that all the Figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DESCRIPTION OF THE PREFERRED EMBODIMENTS

The semiconductor device of FIG. 1 comprises a semiconductor body 10 having front and back, opposite surfaces 11 and 12. A power transistor T and a suppression diode D are integrated in and on the body 10. The power transistor T has a main current path between first and second regions 1 and 2 of the body 10, that are adjacent to the respective front and back surfaces 11 and 12. The regions 1 and 2 are connected to respective front and back metallisations 21 and 22. The body 10 is mounted on a terminal connection area 52 of the device via the back metallisation 22. Typically, the terminal connection area 52 may be a mounting platform of a metal lead-frame of the device encapsulation. A solder or adhesive film 25 may provide the bonding.

Figure 2A:
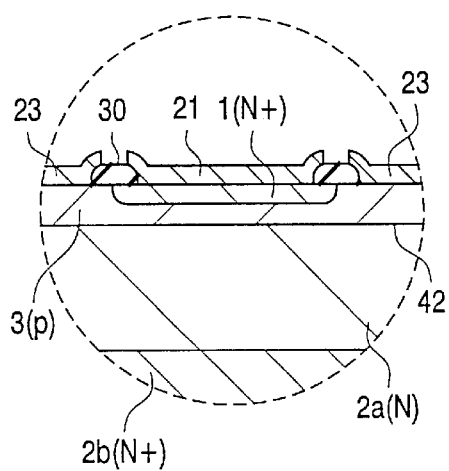
FIG. 2A is a more detailed cross-sectional view of an active transistor cell (circled area A) of FIG. 1 for a bipolar transistor form of the device.
Figure 2B:
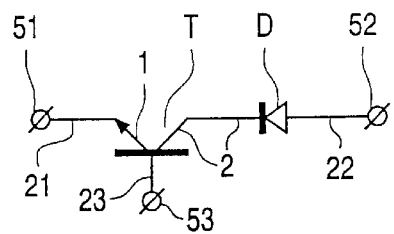
FIG. 2B is an equivalent circuit diagram for the device of FIG. 2A.

In the FIG. 2A form, the power transistor T is of a known NPN bipolar type. The regions 1 and 2 are respectively emitter and collector regions of n-type conductivity, between which a base region 3 of the opposite conductivity type (p-type) is present within the body 10. The part 2b of the collector region 2 adjacent the back surface 12 is highly doped (N+). This highly doped part 2b is separated from the base-collector p-n junction 42 by a more lowly doped (N) part 2a of the collector. The emitter and base regions are contacted by respective emitter and base metallisations 21 and 23, at windows in an insulating layer 30 on the front surface 11. Typically, these front metallisations 21 and 23 may be connected by bond wires to other lead terminals 51 and 53 of the device lead-frame.

Figure 3A:
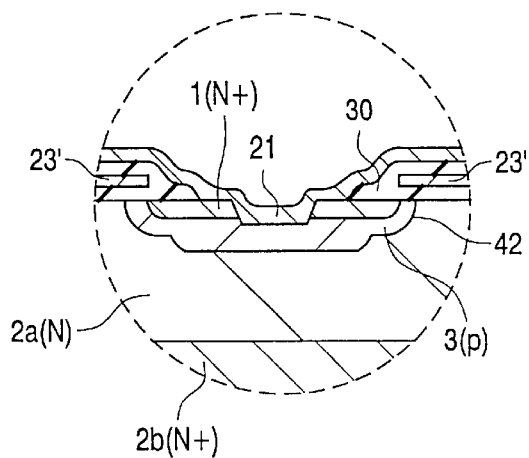
FIG. 3A is a more detailed cross-sectional view of an active transistor cell (circled area A) of FIG. 1 for an insulated-gate field-effect transistor form of the device.
Figure 3B:
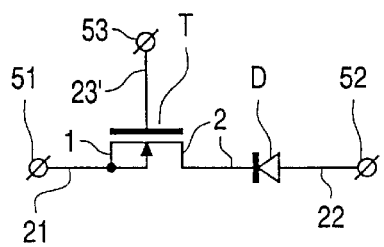
FIG. 3B is an equivalent circuit diagram for the device of FIG. 3A.

In the FIG. 3A form, the power transistor T is of a known n-channel insulated-gate field-effect type. The regions 1 and 2 are respectively source and drain regions of n-type conductivity, between which a base region 3 of the opposite conductivity type (p-type) is present within the body 10. The part 2b of the drain region 2 adjacent the back surface 12 is highly doped (N+). This highly doped part 2b is separated from the p-n junction 42 with the base region 3 by a more lowly doped (N) drift part 2a of the drain. This transistor conducts in known manner (between the regions 1 and 2), when a conductive inversion channel is formed in the base region 3 by field-effect action with an insulated gate 23'. Typically, both the source and base regions 1 and 3 are contacted by the source metallisation 21 at a window in an insulating layer 30 on the front surface 11. The gate 23' is contacted by metallisation (not shown) at the front face of the device. Typically, these source and gate metallisations may be connected by bond wires to other lead terminals 51 and 53 of the device lead-frame.

FIG. 1 illustrates only a few transistor cells, but typically the power transistor T comprises many thousands of parallel cells (such as the FIG. 2A or FIG. 3A cells) in the body 10 between its surfaces 11 and 12. The present invention may be used with power transistors T having quite varied, known cell geometries, and so no plan view of the cellular layout is shown in the drawings. The active cellular area of the transistor T may be bounded around the periphery of the body 10 by various known perimeter termination schemes (similarly not shown in the drawings). Such schemes normally include the formation of a thick field-oxide layer at the peripheral area of the body surface 11, before the transistor cell fabrication steps.

Both in bipolar power transistors (e.g. FIG. 2A) and in field-effect power transistors (e.g. FIG. 3A), the normally reverse-biased p-n junction 42 can act as a parasitic anti-parallel diode. If this parasitic diode is allowed to become forward biased, it can conduct reverse current in the transistor, between the collector/drain region 2 and the base region 3 (and so between terminals 50 and 53 or 51). Significant charge storage effects can then occur in this parasitic diode that is formed with the lower doped part 2a of the second region 2 and has a slow recovery time. This undesirable reverse current flow in the transistor is suppressed by including an opposed diode D in series with the collector/drain region 2. The present invention achieves this aim in an advantageous manner, by providing the suppression diode D as a diode junction 40 between the back metallisation 22 and the region 2 of the power transistor T. Although minority charge carriers (holes, in this case) may be injected into this region 2 by the diode junction 40, the higher doped part 2b of the transistor region 2 is sufficiently thick as to prevent these minority carriers from reaching the p-n junction 42 with the base region 3.

As will be illustrated later with reference to FIG. 6, the thickness Xn of the higher doped part 2b may be many times larger than a diffusion length Lp for minority carriers therein. The diffusion length Lp itself decreases in known manner with increase in the dopant concentration of the region part 2b. Thus, any risk of thyristor action (i.e. latching) between the diode D and the transistor T is suppressed by so choosing the thickness Xn of the region part 2b in relation to its doping concentration N+ (and hence minority carrier diffusion length Lp).

In the embodiments of FIGS. 1 to 8, the diode junction 40 is formed with or in a semiconductor layer 100 on the bottom surface 12 of the body 10. The semiconductor layer 100 contains dopant (e.g. boron or arsenic or phosporus) that determines its conductivity type. Regardless of whether it is p-type or n-type, the conductivity-type-determining dopant concentration (P or N) of the semiconductor layer 100 (at least adjacent to the diode junction 40 with the transistor region 2) is lower than the high dopant concentration (N+) of the transistor region 2. This adjacent lower dopant concentration (P or N) serves in controlling carrier injection across the diode junction 40.

In the specific examples illustrated in FIGS. 1, 2B, 3B and 6, the semiconductor layer 100 is of opposite conductivity type (p-type) to the transistor region 2 (n-type) and forms a p-n junction diode D. Thus, in one form, the semiconductor layer 100 provides the collector region 2 of the bipolar transistor T of FIG. 2A with the p-n junction diode D. In the case of the field-effect transistor T of FIG. 3A, the semiconductor layer 100 provides the drain region 2 with the p-n junction diode D. Typically, the transistor body 10 is of monocrystalline silicon, whereas the semiconductor layer 100 may be of polycrystalline silicon.

In typical embodiments, the dopant concentration (N+) of the highly doped transistor region part 2b is about $10^{18}$ or $10^{19}$ or more dopant atoms $cm^{-3}$, of antimony or arsenic for n-type. The lower dopant concentration (N) of the region part 2a depends on the desired breakdown voltage and other characteristics of the transistor, but may be in the range of, for example, $10^{14}$ to $10^{16}$ dopant atoms $cm^{-3}$, of phosphorus or arsenic for n-type. The base region 3 and emitter/source region 1 are formed in known manner by locally over-doping areas of this lower doped part 2a.

A silicon wafer having the dopant concentration (N) of the region part 2a may be used as the starting material. The higher doped part 2b can then be formed by diffusing a high dopant concentration (N+) into this wafer at the surface 12. Alternatively, a silicon wafer having the high dopant concentration (N+) of the region part 2b may be used as the starting material. The lower doped part 2a can then be formed as an epitaxial layer deposited with its dopant concentration (N) on the wafer, i.e. on the part 2b. In this latter case, the dopant concentration (N+) of the highly doped transistor region 2 can easily be made even higher, for example, up to about $10^{20}$ arsenic atoms $cm^{-3}$ and can be uniform across its thickness Xn. Such a situation is illustrated in FIG. 6. The highly doped (N+) collector or drain region part 2b of a power transistor can be quite thick, for example, with a thickness Xn of about 100 μm (micrometers) or more.

The semiconductor layer 100 may be of polycrystalline silicon (so-called "polysilicon") deposited on the body surface 12. It can be deposited at quite a low temperature, e.g. in the range of 580° C. to 650° C., so as to reduce out-diffusion of dopant from the highly doped transistor region 2. Either during or after deposition, the polysilicon material may be doped with boron (for p-type conductivity). The dopant concentration may be in the range of $10^{15}$ to $10^{18}$ boron atoms $cm^{-3}$. The thickness Xp of the deposited layer 100 may be, for example, about 2 μm or more.

Figure 4:
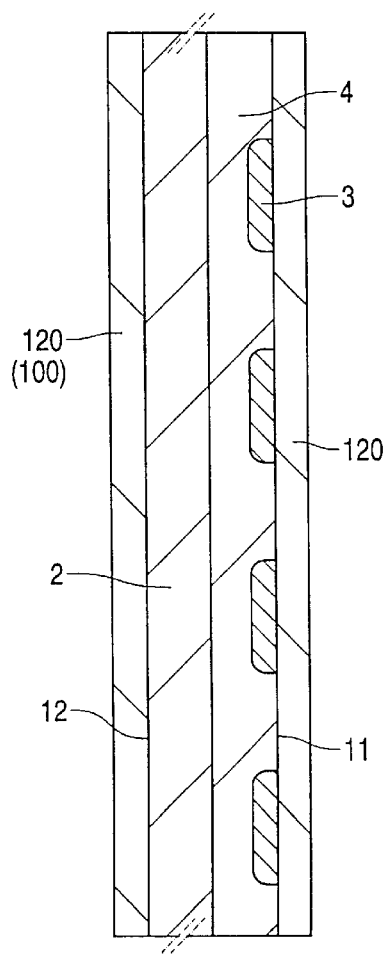
FIGS. 4 and 5 are cross-sectional views of such a device structure as that of FIG. 1 at two stages during its manufacture.
Figure 5:
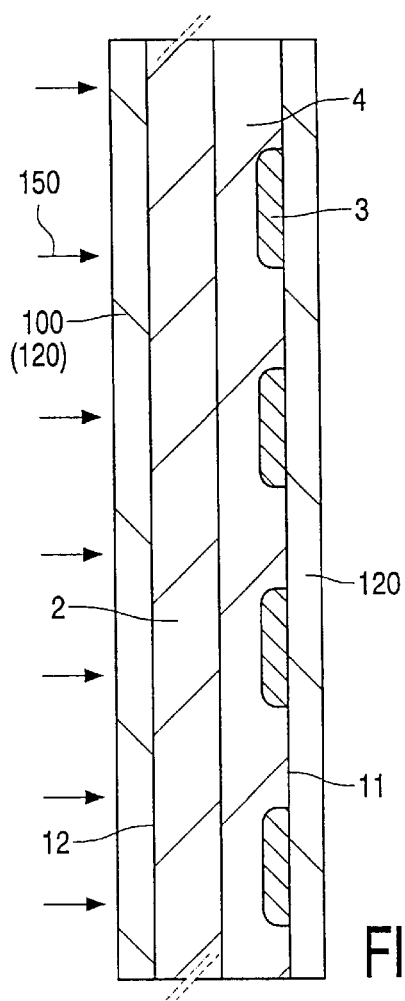

FIG. 4 illustrates a stage of manufacture, in which un-doped polysilicon material 120 is deposited on both the surfaces 11 and 12 of the wafer that provides the transistor body 10. Boron ions are then implanted into the polysilicon layer 100 at the surface 12, as indicated by arrows 150 in FIG. 5. Subsequently, the implanted layer 100 is annealed, for example with rapid thermal annealing. The polysilicon layer 100 on the surface 12 is then masked, and the polysilicon material 120 is etched off the front surface 11. As a result of the deposition and annealing of the polysilicon, a slight diffusion of the N+ concentration of the region part 2b may occur into the layer 100. The resulting p-n junction 40 may be slightly within the polysilicon layer 100, rather than at the surface 12. Such a situation is illustrated in FIGS. 1 and 6.

The conductivity-type-determining dopant concentration (P) of the layer 100 may be at least one or two or more orders of magnitude lower (i.e. at least 10 or 10 times lower) than the high dopant concentration (N+) of the transistor region part 2b. As already described, the latter may be up to about $10^{19}$ or $10^{20}$ dopant atoms $cm^{-3}$, and so this doping relationship between region 2 and layer 100 can usually be readily achieved. Indeed, it is generally desirable to have a very high dopant concentration in the transistor region 2 so as to reduce series resistance in power transistor. FIG. 6 illustrates a specific example in which the difference in doping concentration is a factor of three orders of magnitude.

With a strongly assymetric doping relationship between region part 2b and layer 100, the charge carrier injection is predominantly of electrons from the N+ transistor region 2 to the P layer 100, rather than of holes in the opposite direction. Carrier injection efficiency at the diode junction may also be reduced by the crystallographic transition from polysilicon material to the monocrystalline silicon material of the body 10.

Figure 6:
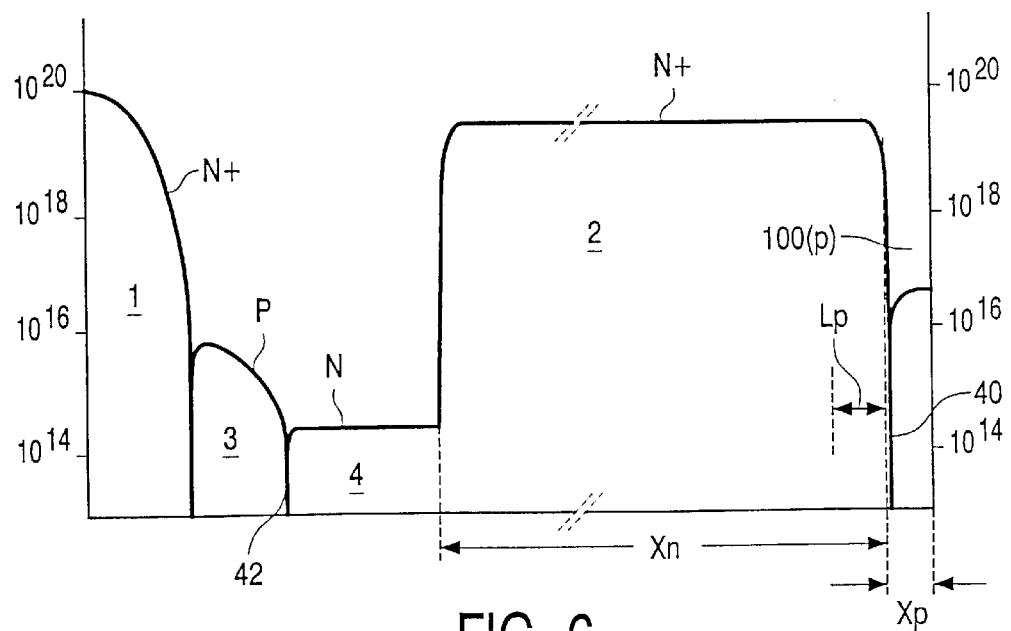
FIG. 6 is one specific illustrative example of a doping profile diagram through the semiconductor regions of the FIG. 1 device, illustrating the prevention of latching.

As illustrated in FIG. 6, the thickness Xn of the higher doped part 2b may be considerably larger (for example, by one or more orders of magnitude) than a diffusion length Lp for minority carriers therein. The diffusion length Lp is less than 1 $\mu$m (1 micrometer) with an arsenic dopant concentration N+ of $5 \times 10^{19}$ $cm^{-3}$ for the region part 2b. The diffusion length Lp increases with decrease in the dopant concentration, being approximately 3 $\mu$m to 4 $\mu$m for an N+ of $1 \times 10^{19}$ $cm^{-3}$. Typically the thickness Xn of the region part 2b may be, for example, in the range of 100 $\mu$m to 150 $\mu$m. Thus, minority carriers injected into the region part 2b will not progress very far into the transistor, and so any risk of thyristor action (i.e. latching) between the diode D and the transistor T is suppressed.

The thickness Xp and doping concentration P of the layer 100 depends on the desired diode characteristics. When the diode junction 40 is provided on the back of a MOSFET used in, for example, A.C. motor control as disclosed in the said Power Semiconductors Applications Handbook 1995 of Philips Semiconductors, the suppression diode D may be required to block 20 to 30 volts. This high blocking voltage can be achieved with a layer 100 that has a doping concentration P of about $5 \times 10^{16}$ $cm^{-3}$ over a thickness of about 3 $\mu$m or more. When the diode junction 40 is provided on the back of a bipolar transistor used in, for example, TV or monitor deflection circuits as disclosed in the said Power Semiconductors Applications Handbook 1995 of Philips Semiconductors, the suppression diode D may only be required to block much smaller voltages, for example about 2 to 3 volts. This low blocking voltage can be achieved with a layer 100 that has a doping concentration P of about, $5 \times 10^{17}$ $cm^{-3}$ over a thickness of about 1 $\mu$m or less.

Figure 7:
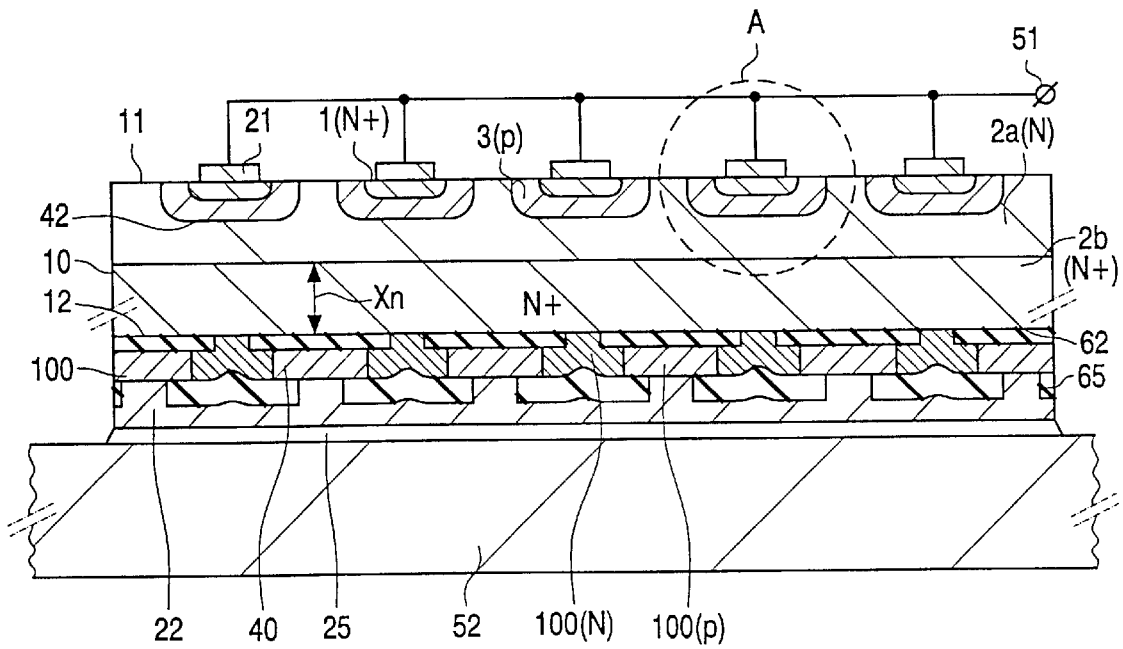
FIG. 7 is a cross-sectional view of another embodiment of a semiconductor device in accordance with the invention, with a different configuration of p-n junction diode.

In the FIG. 1 embodiment, the diode p-n junction 40 is parallel to the body surface 12. FIG. 7 illustrates an embodiment in which the diode p-n junction 40 is perpendicular to the body surface 12.

The FIG. 7 embodiment is of value in situations where dopant out-diffusion from the transistor region 2 is comparable to the thickness Xp of the semiconductor layer 100. In this embodiment, a first windowed insulating layer 62 (for example of silicon dioxide) is provided on the body surface 12 before depositing the semiconductor layer 100. Thus, the insulating layer 62 is present between the semiconductor layer 100 and the N+ region part 2b and masks the semiconductor layer 100 against the dopant out-diffusion except at its windows where the layer 100 adjoins the region part 2b. At these windows, n-type regions of the layer 100 are formed by the out-diffused dopant.

A second windowed insulating layer 65 is provided on the semiconductor layer 100 before depositing the back metallisation 22. The windows in these two insulating layers 62 and 65 are laterally offset with respect to each other.

The semiconductor layer 100 may have been deposited as p-type polysilicon with its desired dopant concentration P. Alternatively, it may have been deposited as un-doped polysilicon. In the latter case, an unmasked boron ion implantation can be carried out to provide the desired low P dopant concentration before depositing the second insulating layer 65. This low P dopant concentration is insufficient to over-dope the n-type regions that were formed by out-diffusion from the transistor region part 2b. Alternatively the low P dopant concentration may be provided by boron ion implantation at the windows in the layer 65.

In each case, the insulating layer 65 is present between the n-type regions of the layer 100 and the back metallisation 22, which contacts the p-type regions of the layer 100 at the windows in the layer 65. In each case, the p-n diode junction 40 within the layer 100 extends across the thickness of the layer 100 where insulated by the first and second insulating layers 62 and 65. The windows in the layers 62 and 65 may have, for example, a stripe geometry and/or interdigitated geometry.

Figure 8:
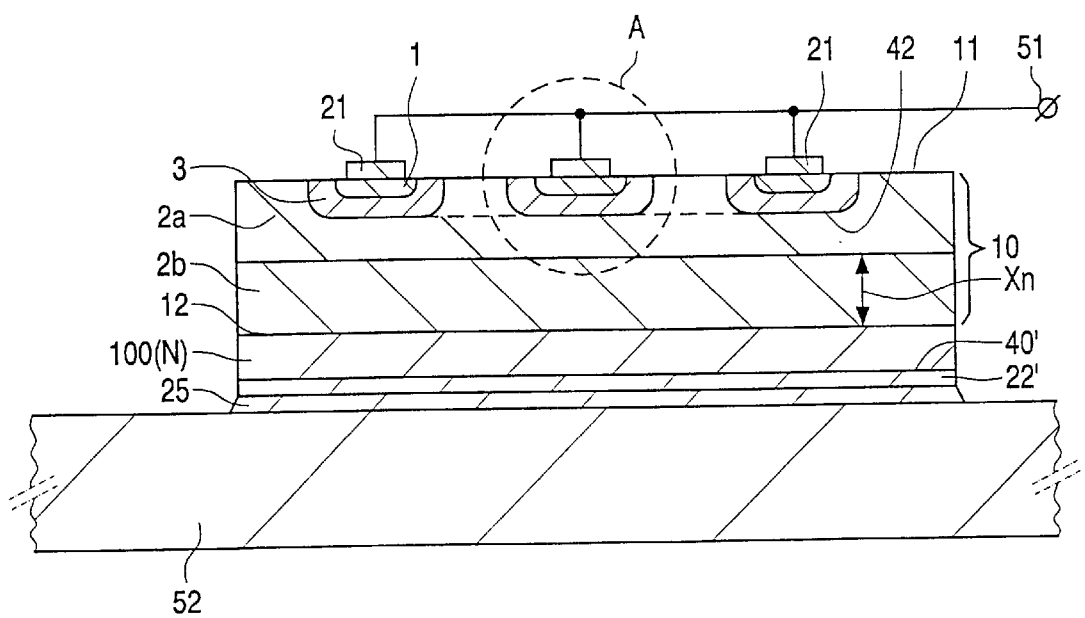
FIG. 8 is a cross-sectional view of a further embodiment of a semiconductor device in accordance with the invention, with a Schottky barrier as the suppression diode.

It will be evident to the reader that many other modifications and variations are possible in devices in accordance with the invention. In the embodiment of FIG. 8 a Schottky diode D is provided, instead of a p-n junction diode D. In this example, the lower conductivity-type-determining dopant concentration (N) of the semiconductor layer 100 adjacent the diode junction is of the same conductivity type as the transistor region 2. This lower dopant concentration N extends to the back metallisation 22' with which it forms a Schottky barrier 40' that provides the diode D. The metallisation 22' may be a thin layer of titanium adjacent to the silicon layer 100, with a thicker titanium-silver layer on the titanium. Such a Schottky diode D may be integrated with either a bipolar power transistor (e.g. as in FIG. 2A) or a field-effect power transistor (e.g. as in FIG. 3A).

FIGS. 2A and 3A illustrate conventional transistor cell structures, in which both the regions 1 and 2 are n-type regions within the body 10. However, the emitter region 1 of a bipolar transistor T and the source region 1 of a field-effect transistor T may alternatively be formed by a deposited layer on the front surface 11 of the body 10. Such a deposited emitter/source layer may be a doped semiconductor material. Alternatively it may be a metal or silicide that forms a Schottky barrier (instead of a p-n junction) with the base region 3. Although the embodiments have been drawn in respect of a NPN bipolar transistor and an n-channel field-effect transistor, it will be obvious to the person skilled in the art that the invention may also be implemented with PNP bipolar transistors and p-channel field-effect transistors.

In the embodiments so far described, the dopant concentration of the first conductivity type of the higher doped region part 2b is typically two or more orders of magnitude higher than the lower conductivity-type-determining dopant concentration P or N of the diode layer 100. The thickness Xn of the transistor region part 2b is typically one or more orders of magnitude larger than a diffusion length Lp for charge carriers of the opposite conductivity type. However, the present invention can also be adopted in situations where the difference in magnitude between the dopant concentrations of the region part 2b and the layer 100 is reduced, and/or the thickness of the transistor region part 2b is reduced. In these situations, additional measures can be taken to reduce carrier injection from the diode D to the transistor region 2.

Figure 9:
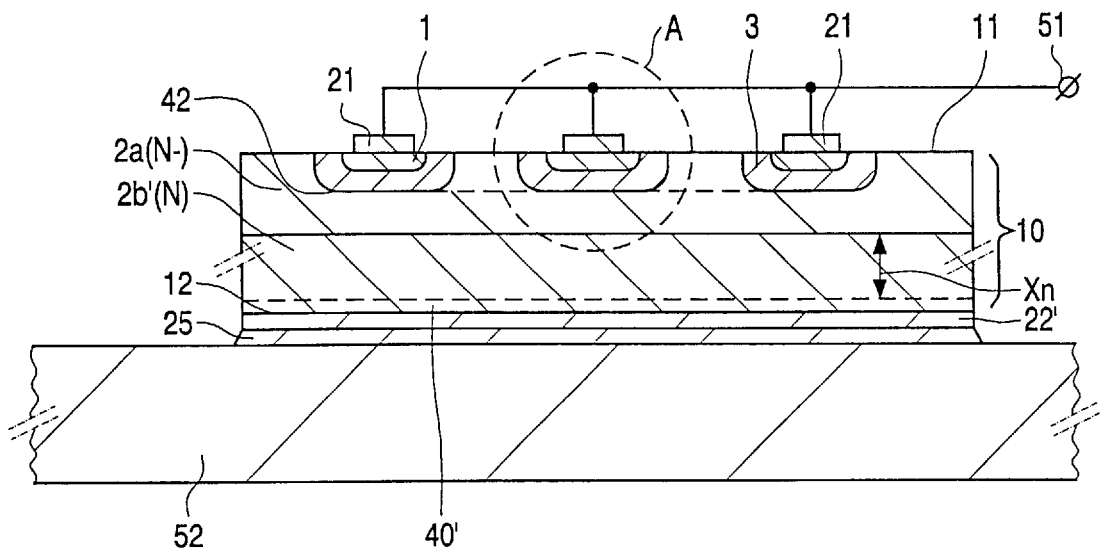
FIG. 9 is a cross-sectional view of yet another embodiment of a semiconductor device in accordance with the invention, with a Schottky barrier diode.

One such measure is to form the diode D as a Schottky barrier 40'. FIG. 8 illustrates an example that retains a low-doped (N) layer 100 on the body surface 12. Another example is illustrated in FIG. 9, in which the Schottky barrier 40' is formed by the back metallisation 22' directly on the back surface 12 of the transistor region part 2b. In this case the doping concentration (N+) of the transistor region part 2b is lower (at least adjacent to the surface 12), and may be, for example, less than $1 \times 10^{18}$ antimony atoms cm$^{-3}$. The minority carrier diffusion length Lp in this $1 \times 10^{18}$ cm$^{-3}$ material may be, for example, 35 μm to 40 μm. Thus, the thickness Xn of the region part 2b may be about 2.5 to 3 times the length Lp in this case.

A measure that can be adopted in the case of a p-n junction 40 is to form the semiconductor layer 100 of a semiconductor material having a narrower band-gap than that of the transistor region 2. In one example, the semiconductor body 10 may be of monocrystalline silicon carbide and the semiconductor layer 100 may be of silicon. Furthermore, the use of a silicon carbide body 10 is attractive for a power transistor operating at a higher temperature. In another example, the semiconductor body 10 may be of monocrystalline silicon, and the semiconductor layer 100 may be of a mixed crystal of silicon-germanium.

Thus, semiconductor materials other than monocrystalline and polycrystalline silicon may be used for the transistor body 10 and the diode layer 100. Furthermore, the semiconductor layer 100 may be an epitaxial layer on the body surface 12, instead of being polycrystalline.

Figure 10:
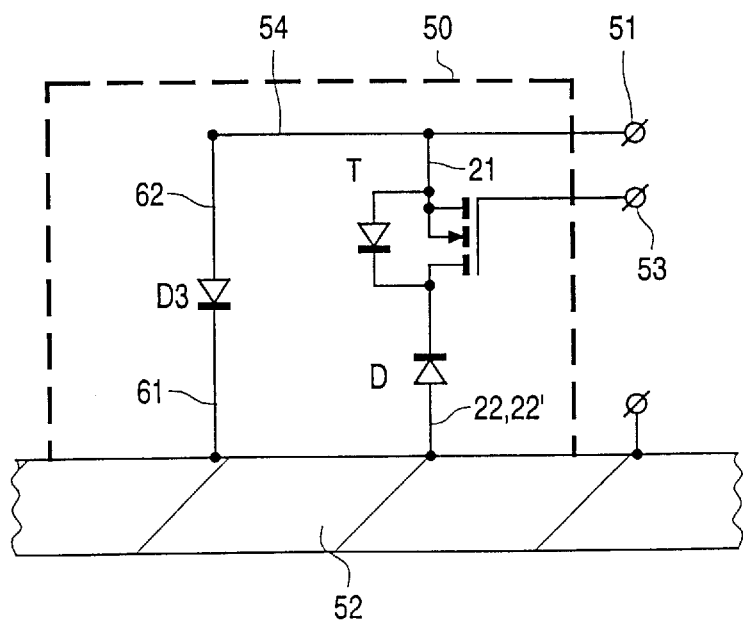
FIG. 10 is a schematic representation of a device in accordance with the invention with the addition of an anti-parallel diode in the device package.

In several circuit configurations, for example as disclosed in the said Power Semiconductors Applications Handbook 1995 of Philips Semiconductors, an anti-parallel diode D3 is required across the series connection of the power transistor T and the suppression diode D. This anti-parallel diode D3 can be included in the same device package as the transistor-diode combination T-D of device in accordance with the present invention. Thus, the device has its suppression diode junction 40,40' integrated in or on the semiconductor body 10 of the transistor T, between the back metallisation 22, 22' and the second (back) region 2 of the transistor T. This configuration permits the anti-parallel diode D3 to be mounted on the same terminal connection area 52 of the device. Thus, the semiconductor body of diode D3 can be mounted in side-by-side relationship with the semiconductor body 10 of the transistor T, as illustrated in FIG. 10. The connection area 52 (for example, a mounting pad of the device lead frame) connects the anode metallisation 61 on the back of D3 to the back metallisation 22, 22' of the transistor-diode combination T-D. The cathode metallisation 62 on the front of D3 can be connected to the front metallisation 21 of the transistor T by, for example, a bond wire 54. These components and their connections to the package leads 51 and 52 can be encapsulated in plastics material 50 to form the device package.

From reading the present disclosure, other variations and modifications will be apparent to persons skilled in the art. Such variations and modifications may involve equivalent and other features which are already known in the design, manufacture and use of semiconductor devices, and component parts thereof, and which may be used instead of or in addition to features already described herein.

Although Claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any Claim and whether or not it mitigates any or all of the same technical problems as does the present invention.

The Applicants hereby give notice that new Claims may be formulated to any such features and/or combinations of such features during the prosecution of the present Application or of any further Application derived therefrom.

What is claimed is:

1. A semiconductor device comprising a semiconductor body in and on which a power transistor and a suppression diode are integrated, wherein the power transistor has a current path between first and second regions that are adjacent to respective front and back surfaces of the body and that are connected to respective front and back metallisations, the body is mounted on a terminal connection area of the device via the back metallisation, a base region of opposite conductivity type is present between the first and second regions and forms a parasitic diode as a p-n junction with an adjacent first part of the second region, which first part has a lower conductivity-type-determining dopant concentration than an underlying second part of the second region, the suppression diode is formed in series with the second region of the power transistor and adjacent to the back surface of the body by a diode junction that is present between the back metallisation and the second part of the second region and that opposes the p-n junction between the second region and the base region so as to suppress reverse current flow in the transistor, and the second part of the second region is sufficiently thick as to prevent minority charge carriers injected into the second region by the diode junction from reaching the p-n junction with the base region;

wherein a semiconductor layer is included on the back surface of the body, between the back surface and the back metallisation, and wherein the semiconductor layer has adjacent to the diode junction a conductivity-type-determining dopant concentration that is lower than the conductivity-type-determining dopant concentration of the first conductivity type of the second part of the second region; and wherein a first windowed insulating layer is present between the semiconductor layer and the second region, a second windowed insulating layer is present between the semiconductor layer and the back metallisation, the windows in the first and second insulating layers are laterally offset with respect to each other, and a p-n junction within the semiconductor layer extends across the thickness of the semiconductor layer where insulated by the first and second insulating layers.

2. A semiconductor device as claimed in claim 1, wherein the adjacent lower conductivity-type-determining dopant concentration of the semiconductor layer is of a second conductivity type that is opposite to the first conductivity type and that forms the diode as a p-n junction with the second region.

3. A semiconductor device as claimed in claim 2, wherein the dopant concentration of the first conductivity type of the second part of the second region is so much higher than the lower conductivity-type-determining dopant concentration of the semiconductor layer as to be diffused into the semiconductor layer to form the p-n junction within the layer.

4. A semiconductor device as claimed in claim 2, wherein the p-n junction extends parallel to the back surface of the body.

5. A semiconductor device as claimed in claim 1, wherein the adjacent lower conductivity-type-determining dopant concentration of the semiconductor layer is of the first conductivity type and extends to the back metallisation, and the back metallisation provides the diode as a Schottky barrier with the lower conductivity-type-determining dopant concentration of the semiconductor layer.

6. A semiconductor device as claimed in claim 1 wherein the dopant concentration of the first conductivity type of the second part of the second region is at least two orders of magnitude higher than the lower conductivity-type-determining dopant concentration of the semiconductor layer.

7. A semiconductor device as claimed in claim 1 wherein the semiconductor layer is a polycrystalline silicon.

8. A semiconductor device as claimed in claim 1, wherein the back metallisation provides the suppression diode as a Schottky barrier with the second part of the second region.

9. A semiconductor device as claimed in claim 1, wherein the second part of the second region has a thickness that is at least an order of magnitude larger than a diffusion length for charge carriers of the opposite conductivity type therein.

10. A semiconductor device as claimed in an claim 1, wherein, side-by-side with the semiconductor body of the transistor, an anti-parallel diode is mounted on the terminal connection area of the device.

11. A semiconductor device as claimed in claim 1, wherein the first and second regions are respectively emitter and collector regions of a bipolar transistor, and the suppression diode is provided between the back metallisation and the collector region of the power transistor.

12. A semiconductor device as claimed in claim 1, wherein the first and second regions are respectively source and drain regions of an insulated-gate field-effect transistor, and the suppression diode is provided between the back metallisation and the drain region of the power transistor.

13. A semiconductor device comprising a semiconductor body in and on which a power transistor and a suppression diode are integrated, wherein the power transistor has a current path between first and second regions that are adjacent to respective front and back surfaces of the body and that are connected to respective front and back metallisations, the body is mounted on a terminal connection area of the device via the back metallisation, a base region of opposite conductivity type is present between the first and second regions and forms a parasitic diode as a p-n junction with an adjacent first part of the second region, which first part has a lower conductivity-type-determining dopant concentration than an underlying second part of the second region, the suppression diode is formed in series with the second region of the power transistor and adjacent to the back surface of the body by a diode junction that is present between the back metallisation and the second part of the second region and that opposes the p-n junction between the second region and the base region so as to suppress reverse current flow in the transistor, and the second part of the second region is sufficiently thick as to prevent minority charge carriers injected into the second region by the diode junction from reaching the p-n junction with the base region;

wherein a semiconductor layer is included on the back surface of the body, between the back surface and the back metallisation, and wherein the semiconductor layer has adjacent to the diode junction a conductivity-type-determining dopant concentration that is lower than the conductivity-type-determining dopant concentration of the first conductivity type of the second part of the second region;

wherein the adjacent lower conductivity-type-determining dopant concentration of the semiconductor layer is of a second conductivity type that is opposite to the first conductivity type and that forms the diode as a p-n junction with the second region;

wherein the dopant concentration of the first conductivity type of the second part of the second region is so much higher than the lower conductivity-type-determining dopant concentration of the semiconductor layer as to be diffused into the semiconductor layer to form the p-n junction within the layer; and wherein a first windowed insulating layer is present between the semiconductor layer and the second region, a second windowed insulating layer is present between the semiconductor layer and the back metallisation, the windows in the first and second insulating layers are laterally offset with respect to each other, and a p-n junction within the semiconductor layer extends across the thickness of the semiconductor layer where insulated by the first and second insulating layers.

14. A semiconductor device as claimed in claim 13, wherein the adjacent lower conductivity-type-determining dopant concentration of the semiconductor layer is of the first conductivity type and extends to the back metallisation, and the back metallisation provides the diode as a Schottky barrier with the lower conductivity-type-determining dopant concentration of the semiconductor layer.

15. A semiconductor device as claimed in claim 13 wherein the dopant concentration of the first conductivity type of the second part of the second region is at least two orders of magnitude higher than the lower conductivity-type-determining dopant concentration of the semiconductor layer.

16. A semiconductor device as claimed in claim 13 wherein the semiconductor layer is a polycrystalline silicon.

17. A semiconductor device comprising a semiconductor body in and on which a power transistor and a suppression diode are integrated, wherein the power transistor has a current path between first and second regions that are adjacent to respective front and back surfaces of the body and that are connected to respective front and back metallisations, the body is mounted on a terminal connection area of the device via the back metallisation, a base region of opposite conductivity type is present between the first and second regions and forms a parasitic diode as a p-n junction with an adjacent first part of the second region, which first part has a lower conductivity-type-determining dopant concentration than an underlying second part of the second region, the suppression diode is formed in series with the second region of the power transistor and adjacent to the back surface of the body by a diode junction that is present between the back metallisation and the second part of the second region and that opposes the p-n junction between the second region and the base region so as to suppress reverse current flow in the transistor, and the second part of the second region is sufficiently thick as to prevent minority charge carriers injected into the second region by the diode junction from reaching the p-n junction with the base region; and further comprising a semiconductor layer and a first windowed insulating layer that is present between the semiconductor layer and the second region, a second windowed insulating layer that is present between the semiconductor layer and the back metallisation, the windows in the first and second insulating layers are laterally offset with respect to each other, and a p-n junction within the semiconductor layer extends across the thickness of the semiconductor layer where insulated by the first and second insulating layers.

18. A semiconductor device as claimed in claim 17, wherein the semiconductor layer has a lower conductivity-type-determining dopant concentration of a second conductivity type that is opposite to the first conductivity type and that forms the diode as a p-n junction with the second region; and wherein the dopant concentration of the first conductivity type of the second part of the second region is so much higher than the lower conductivity-type-determining dopant concentration of the semiconductor layer as to be diffused into the semiconductor layer to form the p-n junction within the layer.

19. A semiconductor device as claimed in claim 17, wherein a semiconductor layer is included on the back surface of the body, between the back surface and the back metallisation, and wherein the semiconductor layer has adjacent to the diode junction a conductivity-type-determining dopant concentration that is lower than the conductivity-type-determining dopant concentration of the first conductivity type of the second part of the second region; and wherein the adjacent lower conductivity-type determining dopant concentration of the semiconductor layer is a second conductivity type that is opposite to the first conductivity type and that forms the diode as a p-n junction with the second region.

20. A semiconductor device as claimed in claim 17, wherein a semiconductor layer is included on the back surface of the body, between the back surface and the back metallisation, and wherein the semiconductor layer has adjacent to the diode junction a conductivity-type-determining dopant concentration that is lower than the conductivity-type-determining dopant concentration of the first conductivity type of the second part of the second region; and wherein the dopant concentration of the first conductivity type of the second part of the second region is so much higher than the lower conductivity-type-determining dopant concentration of the semiconductor layer as to be diffused into the semiconductor layer to form the p-n junction within the layer.

* * * * *